United States Patent
Spacie et al.

(10) Patent No.: US 8,034,451 B2
(45) Date of Patent: Oct. 11, 2011

(54) CARBON MATERIALS

(75) Inventors: Christopher John Spacie, Swansea (GB); Robert Kellson Davies, Swansea (GB); Christopher Anthony Stirling, Swansea (GB)

(73) Assignee: Morganite Electrical Carbon Limited, Morriston, Swansea, South Wales (GB)

( * ) Notice: Subject to any disclaimer, the term of this patent is extended or adjusted under 35 U.S.C. 154(b) by 0 days.

(21) Appl. No.: 12/094,336

(22) PCT Filed: Nov. 30, 2006

(86) PCT No.: PCT/GB2006/004472
§ 371 (c)(1),
(2), (4) Date: May 20, 2008

(87) PCT Pub. No.: WO2007/063309
PCT Pub. Date: Jul. 6, 2007

(65) Prior Publication Data
US 2008/0274358 A1    Nov. 6, 2008

(30) Foreign Application Priority Data

Dec. 2, 2005  (GB) .................................. 0524669.9
Jul. 14, 2006  (GB) .................................. 0614090.9

(51) Int. Cl.
*B32B 9/00* (2006.01)
(52) U.S. Cl. ..................................... 428/408; 423/447.1
(58) Field of Classification Search .................. 428/408, 428/293; 423/447.1, 447.3, 445 B; 165/185
See application file for complete search history.

(56) References Cited

U.S. PATENT DOCUMENTS

| 3,404,061 | A |   | 10/1968 | Shane et al. |
| 3,619,286 | A |   | 11/1971 | Gutnajer et al. |
| 3,676,535 | A |   | 7/1972  | Juel |
| 3,969,124 | A |   | 7/1976  | Stewart |
| 4,248,925 | A |   | 2/1981  | Ambrogi |
| 4,264,803 | A |   | 4/1981  | Shinko |
| 4,282,288 | A |   | 8/1981  | Yoshino et al. |
| 4,495,378 | A |   | 1/1985  | Dotzer et al. |
| 4,786,438 | A | * | 11/1988 | Blackmore ................... 252/510 |
| 4,847,021 | A | * | 7/1989  | Montgomery et al. ...... 264/29.3 |
| 4,878,152 | A |   | 10/1989 | Sauzade et al. |

(Continued)

FOREIGN PATENT DOCUMENTS

DE    102006056812    3/2008

(Continued)

OTHER PUBLICATIONS

High-Tech in Raw Materials, "Graphite for Polymer Materials".

(Continued)

*Primary Examiner* — David Sample
*Assistant Examiner* — Daniel H Miller
(74) *Attorney, Agent, or Firm* — Smith, Gambrell & Russell, LLP (57) ABSTRACT

A graphite body comprises aligned graphite flakes bonded with a binder, in which the graphite has an average particle size of >200 μm.
Methods of forming such highly oriented graphite material include:—
 a) forming a mixture of a mesophase pitch with a graphite powder;
 b) rolling the mixture to align the graphite powder and to form a body of graphite and pitch;
 c) carbonising the body; and optionally
 d) graphitising the body.
Pressing rather than rolling may be employed.
Such graphite bodies have high thermal conductivity and anisotropy and may be used for thermal management.

32 Claims, 2 Drawing Sheets

U.S. PATENT DOCUMENTS

| | | | |
|---|---|---|---|
| 4,891,126 A * | 1/1990 | Mochida et al. | 208/39 |
| 4,891,203 A | 1/1990 | Singer et al. | |
| 4,963,414 A | 10/1990 | LeVasseur et al. | |
| 5,192,605 A | 3/1993 | Mercuri et al. | |
| 5,296,310 A | 3/1994 | Kibler et al. | |
| 5,523,260 A | 6/1996 | Missele | |
| 5,542,471 A | 8/1996 | Dickinson | |
| 5,766,765 A | 6/1998 | Inoue et al. | |
| 5,837,081 A | 11/1998 | Ting et al. | |
| 5,863,467 A | 1/1999 | Mariner et al. | |
| 6,027,807 A | 2/2000 | Inoue et al. | |
| 6,075,701 A | 6/2000 | Ali et al. | |
| 6,119,573 A | 9/2000 | Berens et al. | |
| 6,131,651 A | 10/2000 | Richey, III | |
| 6,208,513 B1 | 3/2001 | Fitch et al. | |
| 6,215,661 B1 | 4/2001 | Messenger et al. | |
| 6,257,329 B1 | 7/2001 | Balzano | |
| 6,426,133 B1 | 7/2002 | Kondo et al. | |
| 6,482,520 B1 * | 11/2002 | Tzeng | 428/408 |
| 6,503,626 B1 | 1/2003 | Norley et al. | |
| 6,514,616 B1 | 2/2003 | Gandi et al. | |
| 6,538,892 B2 | 3/2003 | Smalc | |
| 6,746,768 B2 | 6/2004 | Greinke et al. | |
| 6,758,263 B2 | 7/2004 | Krassowski et al. | |
| 6,771,502 B2 | 8/2004 | Getz, Jr. et al. | |
| 6,777,086 B2 | 8/2004 | Norley et al. | |
| 6,841,250 B2 | 1/2005 | Tzeng | |
| 6,844,054 B2 | 1/2005 | Whatley | |
| 2003/0077449 A1 | 4/2003 | Tzeng | |
| 2003/0099836 A1 | 5/2003 | Gandi et al. | |
| 2003/0230400 A1 | 12/2003 | McCordic et al. | |
| 2004/0074899 A1 | 4/2004 | Mariner et al. | |
| 2006/0029805 A1 | 2/2006 | Pappano et al. | |
| 2006/0230615 A1 | 10/2006 | Lin | |
| 2007/0053168 A1 | 3/2007 | Sayir et al. | |
| 2007/0158050 A1 | 7/2007 | Norley | |
| 2007/0289730 A1 | 12/2007 | Wu | |
| 2008/0008216 A1 | 1/2008 | Miller et al. | |
| 2008/0066676 A1 | 3/2008 | Mariner et al. | |
| 2008/0111943 A1 | 5/2008 | Kim | |
| 2008/0128067 A1 | 6/2008 | Sayir et al. | |
| 2008/0149322 A1 | 6/2008 | Ottinger et al. | |

FOREIGN PATENT DOCUMENTS

| | | |
|---|---|---|
| EP | 0318175 | 5/1989 |
| EP | 0691803 | 10/1996 |
| EP | 0805463 | 5/1997 |
| EP | 1492396 | 12/2004 |
| EP | 1783833 | 9/2007 |
| EP | 2012355 | 7/2009 |
| FR | 2387923 | 4/1977 |
| GB | 871068 | 6/1961 |
| GB | 991581 | 5/1965 |
| GB | 1210776 | 10/1970 |
| GB | 145446 | 11/1976 |
| GB | 1526809 | 10/1978 |
| GB | 2035984 A | 6/1980 |
| GB | 2356288 | 5/2001 |
| JP | 51150506 | 6/1975 |
| JP | 52024210 | 8/1975 |
| JP | 55060013 | 10/1978 |
| JP | 57067011 | 4/1981 |
| JP | 2000086343 | 3/2000 |
| JP | 2006188022 | 7/2006 |
| JP | 2006272785 | 10/2006 |
| JP | 2007067007 | 3/2007 |
| JP | 2007083716 | 4/2007 |
| JP | 2007111943 | 5/2007 |
| JP | 2007222797 | 9/2007 |
| WO | WO 01/98724 | 12/2001 |
| WO | 02/090291 A1 | 11/2002 |
| WO | WO 03/020510 | 3/2003 |
| WO | WO 2004/097934 | 11/2004 |
| WO | WO 2004/097936 | 11/2004 |

OTHER PUBLICATIONS

S. Desai et al, "Transport Properties of Natural Graphite Flake Composites" Institute for Materials Research, University of Leeds, Leeds UK.

Mitsubishi Gas Chemical Company, Inc., "Synthesized Mesophase Pitch" AR The ideal raw material for high performance carbon products.

Institute for Materials Research S. A. Desai, "Thesis: Fabrication and Analysis of Highly Conducting Graphite Flake Composites" 2006.

* cited by examiner

CARBON MATERIALS

REFERENCE TO RELATED APPLICATIONS

This application claims the benefit of priority applications filed in the United Kingdom 0524669.9 of Dec. 2, 2005 and 0614090.9 of Jul. 14, 2006 which are relied on and incorporated herein by reference.

INTRODUCTION AND BACKGROUND

This invention relates to carbon materials. The invention particularly relates to thermally anisotropic carbon materials.

Among their many applications, carbon materials are used for heat management purposes. This is particularly critical in electronics applications. More compact and sophisticated electronic devices and advances in semiconductor technology have resulted in rising transistor density and switching speed of microprocessors. This has been accompanied by drastic increases in heat production.

In response to this challenge, commercial companies are focusing on developing high performance, low cost, compact, and reliable schemes to handle these very large thermal loads.

The technologies proposed to date rely on the concepts of heat spreaders and heat sinks and various combinations of spreaders and sinks.

A heat spreader is an article that spreads heat quickly. A heat spreader requires high thermal conductivity and low heat capacity.

A heat sink is an article that absorbs heat quickly. It stores heat so it needs high thermal conductivity and high heat capacity.

Conventionally in electronics, heat is spread out by a heat spreader to a heat sink and then removed from the heat sink to the surroundings either by natural convection or by forced flow of a coolant (e.g. fan cooling). For more demanding applications other solutions such as heat pipes or liquid cooled systems may be required.

A carbon based material that has been proposed for use as a heat spreader is diamond. Diamond has the highest known thermal conductivity of any material. However it is currently expensive to make. Diamond is also isotropic in nature, the thermal conductivity in any one direction being the same as in any other direction. This means that as well as spreading heat, a diamond heat spreader allows heat to pass through it to the side remote the source of heat. This can be disadvantageous in applications where components are in close proximity.

A thermally anisotropic carbon material is graphite. The crystal structure of graphite comprises layers within which there is strong bonding, with weak bonding between the layers. Additionally, within each layer there are delocalised electrons. This structure leads to a high degree of anisotropy, with thermal (and electrical) conductivity within the plane being very much higher than thermal (and electrical) conductivity through the plane.

To exploit this anisotropy, several proposals have been made for graphite based heat spreaders and sinks, for example among recent proposals are:—

U.S. Pat. No. 6,746,768 which discloses a thermal interface material comprising a flexible graphite sheet containing oil which reduces thermal resistance when attached to a component.

U.S. Pat. No. 6,771,502 which discloses a finned heat sink constructed from the above resin-impregnated graphite sheets.

U.S. Pat. No. 6,758,263 which discloses an anisotropic laminated graphite heat sink made of the above resin-impregnated graphite sheets which has a cavity into which is inserted a thermally conductive material. The heat from a heat source can be conducted via the core and into the thickness of the heat sink and then out across the plane of the heat sink.

U.S. Pat. No. 6,841,250 which discloses heat sink designs using such laminated graphite sheets for conducting heat away from an electronic component and dissipating it through the heat sink.

U.S. Pat. No. 6,777,086 which discloses resin impregnated exfoliated graphite sheets which are resin-impregnated (5-35% wt) and calendered to 0.35-0.50 mm.

U.S. Pat. No. 6,503,626 which discloses that such resin impregnated graphite sheets may be comminuted, pressed & cured to form a block which can then be machined into a desired finned shape.

U.S. Pat. No. 6,844,054 which discloses resin impregnated carbon fibre heat sinks of various geometric designs (cones, pyramids, domes, etc.).

U.S. Pat. No. 6,119,573 which discloses the use of carbon fibre material as a thermally conductive interface between a missile housing and an electronics package to give a low weight high thermal conductivity heat sink.

U.S. Pat. No. 5,837,081 which discloses a composite produced from a mat of graphitised (to 2800° C.) vapour grown fibre (i.e. highly oriented pyrolytic graphite—HOPG) which is densified by chemical vapour deposition (CVD) of pyrolytic carbon.

U.S. Pat. No. 6,514,616 which proposes the use of highly oriented pyrolytic graphite encapsulated in polyimide, epoxy or other polymer.

US 2006/0029805 [published after the earliest priority date of the present application] discloses the idea of hot pressing graphites with a mesophase pitch or phenolic resin as a binder and heat treating to graphitise the binder. US 2006/0029805 discloses that pressing preferably aligns the graphite perpendicular to the moulding direction and that such composite materials have high thermal conductivities (paragraph [0040] shows thermal conductivities of 204.4 W/mK and 76.8 W/mK in the in-plane and through-plane directions for a mesophase pitch binder material). US 2006/0029805 also discloses that mesophase pitch binder materials have a higher thermal conductivity than resin binder materials.

Other patents using graphite's anisotropic thermal conductivity for thermal management include U.S. Pat. No. 4,878,152, U.S. Pat. No. 5,542,471, U.S. Pat. No. 6,208,513, U.S. Pat. No. 5,523,260, U.S. Pat. No. 5,766,765, U.S. Pat. No. 6,027,807, U.S. Pat. No. 6,131,651.

Despite this widespread use of graphite the performance and cost of graphite based materials varies widely. This is because the degree of anisotropy depends upon the degree of orientation of the graphite. To obtain a highly oriented graphite is difficult.

In their patent application WO02/090291 the applicants proposed a method of forming a graphite material comprising the steps of:— a) forming under high shear a mouldable composition comprising:—
  i) graphite powder; and
  ii) a binder; and
  iii) a fluid carrier
b) working said mouldable composition under high shear to form an extruded shape
c) forming bodies from said shape;
d) heat treating said bodies to stabilise the structure; and
e) machining the bodies to form features in their surfaces.

The high shear working of the compositions could be by rolling.

WO02/090291 concentrated on aqueous binders but did mention the possibility of using pitch based binders. The purpose behind WO02/090291 was to provide a highly graphitic body without the need for a high temperature graphitisation step Pitch comes in many forms. One such form is mesophase pitch (sometimes called liquid crystal pitch). Mesophase pitch is a partially pyrolysed material containing highly linked aromatic groups and is in effect a pitch part way through conversion to graphite. Continued pyrolysis results in graphitisation. Mesophase pitch is sometimes used as a matrix material in carbon-carbon composites to bind carbon fibres.

SUMMARY OF THE INVENTION

The applicants have realised that a highly oriented graphite material can be obtained by the process of:—
- forming a mixture of a mesophase pitch with a graphite powder
- rolling the mixture to align the graphite powder and to form a body of graphite and pitch
- carbonising the body
- and, optionally,
- graphitising the body.

The applicants have further realised that:—
- the thermal conductivity depends upon the size of the graphite used and that large graphite particles provide a dramatically higher thermal conductivity than small graphite particles
- density is also a determinant in thermal conductivity of such graphite composites
- purity of the graphite affects thermal conductivity of such graphite composites
- graphitisation is not always necessary to achieve a high thermal conductivity.

As a result the applicants have provided methods for producing graphite composite materials having a high thermal conductivity.

Such materials have a high thermal anisotropy and are suitable for use as heat spreaders.

BRIEF DESCRIPTION OF THE DRAWINGS

The invention is as set out in the claims. The invention is exemplified in the following illustrative description and the accompanying drawings in which:—

DETAILED DESCRIPTION OF INVENTION

The Raw Materials
Mesophase Pitch

Mesophase pitch comes in many varieties but the applicants have found that AR mesophase pitch [manufactured by Mitsubishi Gas Chemical Company Inc. by polymerisation of naphthalene or alkyl-naphthalene using a super acid catalyst] gives good results. AR mesophase pitch comes in the form of pellets (typically 3 mm-7 mm in size) which have a softening point of ~275° C. For effective mixing the pitch may be milled to a suitable particle size. The applicants have determined however that the size also affect the thermal conductivity of the end material. The applicants have compared pitches with particle sizes ~500 µm and ~180 um. It was found in rolling experiments that the larger ~500 µm sized particles hindered alignment in the pressed preform and this misalignment carried through to the rolled material. Although the preform is heated afterwards and rolled, the applicants believe that possibly there will be a non-homogeneous distribution of binder around the graphite flake. The finer particle size of ~180 um did not show such misalignment of the flakes in the as-cold pressed preform, accordingly, a pitch particle size of less 500 µm, preferably less than 200 µm is preferred.

The pitch may if desired be treated to remove volatile components. At low pitch quantities this may not be necessary but at higher pitch quantities evolution of volatiles during heat treatment may be a problem and inhibit pitch-graphite adhesion. De-gassing the pitch, for example by heat treatment, can alleviate this problem.

Graphite

A natural or a synthetic graphite may be used, but natural gives better results as tending to be better aligned and having a higher inherent anisotropy than synthetic graphite. Larger particle sizes are preferred (as is explained below). Preferably an average particle size of >200 µm is preferred. Usable materials include:—
a) Graphite RFL 99.5 a 99.86% pure natural graphite available from Graphitwerke Kropfmühl which has a flake size distribution [% by weight>than specified sieve size]: 50%>200 µm, 25%>355 µm
b) Graphite V-RFL 99.5+500 a 99.86% pure natural graphite available from Graphitwerke Kropfmühl which has a flake size distribution [% by weight>than specified sieve size]: 30%>800 µm, 77%>630 µm, 95%>500 µm.
c) Graphite GRAF-X 20×35/93, a dry processed low purity graphite available from Industrial Minerals, Inc. of Minnesota, USA, which has a flake size distribution<1%<500 µm, 85% 500-850 µm 14% 850-200 µm and ash content<7 wt %.

It should be noted that natural graphite may if desired be purified. For example, thermal purification may be used.

For high thermal conductivity, the amount of graphite in the materials preferably exceeds 50% by volume, more preferably exceeds 70% by volume, and indeed above 80% by volume is within the scope of this invention. However extremely high graphite loadings [e.g. 99% by volume] risk failure to provide adequate alignment and so graphite loadings of 99% or less and indeed 95% or less by volume are also within the scope of this invention.

Plasticiser

Ammonium lignosulphonate may be used as a plasticiser as described below.

Resins

Any resin that acts a binder may be used.

The Rolling Process
Mixing

The graphite may be incorporated into molten pitch, but to improve mixing and limit the damage to the graphite, it is preferable to dry blend the pitch and graphite to produce a homogeneous blend. The blend can then be heated to melt the pitch, so forming a melted mixture of graphite in molten pitch. The melted mixture may be stirred to prevent separation or segregation of the graphite. For reasons that will become clear below, damage to the graphite should be avoided as much as possible and so low shear processes are preferred.

The relative amounts of graphite and pitch are chosen so as to meet the requirements that:—
the mixture can be rolled
the rolled material has adequate strength prior to carbonising
after carbonising, the carbonised product has adequate strength prior to graphitising
after graphitising, the graphitised product has adequate strength.

Typically, the amount of pitch can lie between 5% and 30% by volume, preferably being in the range 10% to 25% for ease of forming.

Before rolling the molten mixture should preferably be kept away from air, since oxygen accelerates cross-linking of the pitch. Keeping the molten mixture under an inert atmosphere (e.g. nitrogen) meets this need.

The melted mixture temperature should preferably be at least 15° C. above the softening temperature of the pitch. For AR pitch a temperature of 350° C. is adequate.

Rolling

The melted mixture is passed through rollers maintained at a temperature such that the melted mixture does not stick [e.g. ~350° C.]. The roller separation may be set to provide a desired thickness for the rolled material in one step, or the material may be passed through several rollers to gradually diminish the thickness. The rolling must be to a sufficient extent to produce alignment of the graphite flakes. Rolling also has the effect of flattening (to some extent) graphite flakes that have been bent during processing. However rolling should not be too extreme and to reduce the risk of introducing excessive shear into the microstructure rolling speeds should preferably be kept low.

It can be advantageous in some circumstances to provide differential rolling speeds which would provide some increase in through plane conductivity at the expense of in-plane conductivity.

It may be advantageous in some circumstances to provide a cold-pressing step to form a preform prior to heating and rolling. However this requires care. Pressing of itself introduces a texture into the material, and rolling can then shear that texture resulting in a complex sheared microstructure in the rolled material reducing in-plane conductivity and increasing through plane conductivity. To reduce this risk, the thickness of the preform should preferably be close to the roller separation. For example, comparisons between pressed preforms of 4 mm, 3 mm, and 2 mm thickness rolled to 0.75 mm thickness has shown significant misalignment in the 4 mm thickness preform but little misalignment in the 2 mm preform with 3 mm lying somewhere in between. [These tests were conducted on a material comprising 90 wt % graphite b) above with 10 wt % AR mesophase pitch (approximately 84.4:15.6 vol % graphite:pitch)].

Carbonising

The rolled material is then carbonised by heating it under a protective atmosphere to temperatures sufficient to carbonise the pitch—i.e. to remove the hydrogen from the pitch and induce some cross-linking. Typical carbonising temperatures are 1000° to 1500° C., with 1250° C. to 1350° C. being a preferred range.

Graphitising

The carbonised material is then graphitised by exposure to high temperatures [>2000° C., preferably 2200° C.-2800° C. and even as high as ~3000° C. Such graphitisation must be done under a protective atmosphere such as an inert atmosphere, a reducing atmosphere, or vacuum.

During graphitisation the carbonised pitch is converted into graphite.

The carbonising and graphitising steps may form part of a single process, with the rolled material being gradually brought up to a graphitising temperature while passing through a temperature at which carbonising occurs.

Graphitising may be an optional step, as established for pressing [see below].

The Rolled Product

The rolling process results in mechanical alignment of the flake graphite parallel to the rolling plane, and to some extent a flattening of the flake graphite. The applicants believe that mesophase pitch generally wets the graphite well, and the graphite provides a template for alignment of the mesophase. This alignment results in graphite being formed aligned with the flake. Such alignment provides high thermal conductivity within the plane of the material, but low thermal conductivity through plane. The applicants also suspect an additional effect to be active, namely align the discotic nematic liquid crystalline molecules of the mesophase pitch in the shear direction.

Rolling Examples

To test the feasibility of this method, mixtures were made using both of the graphites a) and b) mentioned above. The graphite was dry blended with the ground AR mesophase pitch to produce a homogeneous mixture comprising by volume %:—

Graphite—75%
AR mesophase—23.5%
Ammonium lignosulphonate—1.5%

The ammonium lignosulphonate was included as a combined binder and plasticiser by analogy with WO02/090291 in which this ingredient was used. The applicants have found that when rolling compositions with this level of pitch to less than 1 mm, or if using lower pitch contents [e.g. 10%], problems occur during rolling or when handling of the rolled material if this component is not used. Lignosulphonates are materials obtainable from wood and are available from both hard and soft woods. Lignosulphonates may be modified and include altered cations. For the present invention all lignosulphonates may be used, modified or unmodified, and may include any suitable cation or cations, for example calcium, magnesium, ammonium and sodium. The present invention is not restricted to the use of lignosulphonates as the plasticiser and other materials (e.g. thermoplastic polymers) may be used for this function.

To provide an inert atmosphere for the melting, an amount of dry blend was encapsulated in aluminium foil and then heated in an air circulation furnace at 350° C. for a time of approximately 15 minutes. This melted the mesophase pitch [which had a measured softening temperature in the range 290° C. to 320° C.].

The molten mixture encapsulated in foil was then removed from the oven and fed through the rollers of the mill. The roll gap was set to 1.5 mm for these samples. The rolled material produced was then removed from the foil [contact with air at this stage is not detrimental since it acts to catalyse cross-linking].

The rolled material was then carbonised at 1000° C. by heating to 1000° C. at a rate of 24°/hour and then soaking at 1000° C. of 0.5 hours. During carbonisation the rolled material was kept in a non-oxidising environment by packing in a saggar and covering with kiln dust [which acts as a sacrificial material, scavenging oxygen].

The carbonised material was then graphitised in a continuous graphitising furnace for 4.5 hours at 2500° C. under a self-generated atmosphere believed to be largely carbon monoxide.

Thermal Conductivity Results for Rolled Product

Thermal diffusivity was measured at the Tyndall Institute in Cork. The line heat source laser flash method was used for measurement in-plane and conventional laser flash for through-plane measurement. Results are shown in Table 1.

TABLE 1

| Sample | Direction | Measured Thermal Diffusivity ($10^{-5}$ m$^2$s$^{-1}$) | Thermal Conductivity* (WmK$^{-1}$) |
|---|---|---|---|
| Graphite a) RFL 99.5/ARMP [Measured density 1.66 g·cm$^{-3}$] | Parallel to rolling direction | 46.8 | 552 |
| | Perpendicular to rolling direction | 37 | 436 |
| | Through-plane | 1.9 | 22 |
| Graphite b) V-RFL 99.5 + 500/ARMP [Measured density 1.58 g·cm$^{-3}$] | Parallel to rolling direction | 57.1 | 641 |
| | Perpendicular to rolling direction | 44.2 | 496 |
| | Through-plane | 2.4 | 27 |

Figure 1:
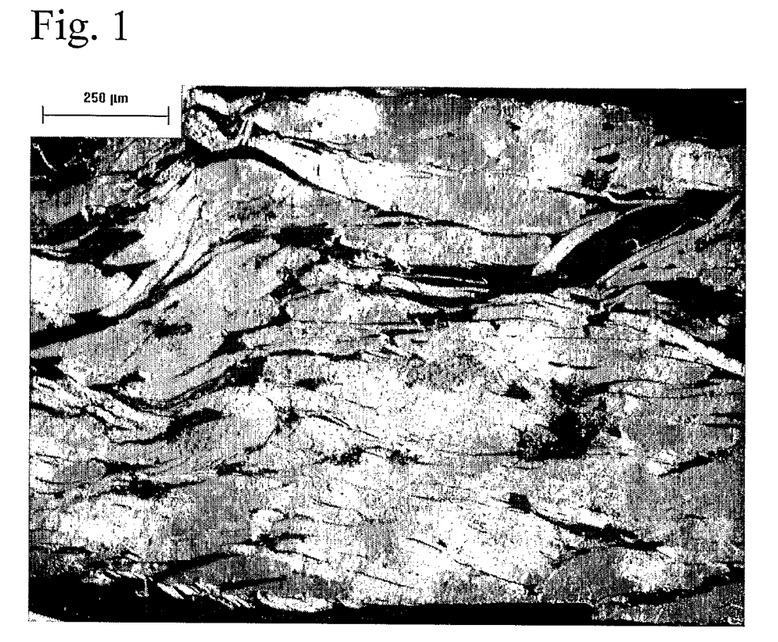
FIG. 1 is a micrograph indicating the degree of alignment achieved with a first type of graphite
Figure 2:
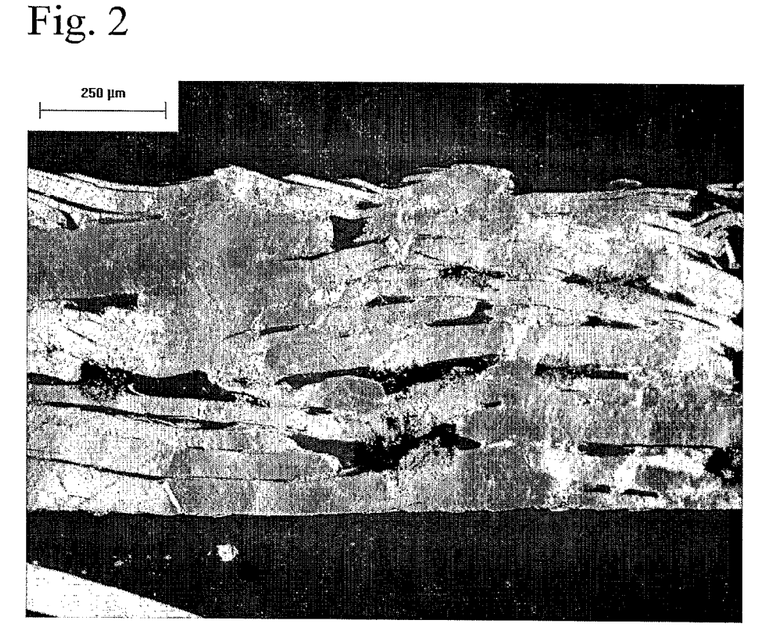
FIG. 2 is a micrograph indicating the degree of alignment achieved with a second type of graphite.

*thermal conductivity = thermal diffusivity × density × specific heat; where density is taken as measured, and specific heat taken as 0.71 kJ/kgK The method can therefore provide materials that have an in-plane thermal conductivity of >400 WmK$^{-1}$ and a through plane thermal conductivity of <30 WmK$^{-1}$. It can be seen that larger graphite size [graphite b)] gives a higher thermal conductivity than the smaller graphite size despite the lower measured density. The density measured reflected the presence of voids in the material as indicated in FIGS. 1 and 2. The applicants have found that rolling to a thinner gauge than in these experiments can result in a density of around 1.8 g·cm$^{-3}$ and so give a higher thermal conductivity still. However the processing variables need to be carefully adjusted, since over processing can result in graphite misalignment or breakage such that an over-worked material has lower thermal conductivity than a less worked material.

In the alternative, a material containing such voids may be further processed by impregnation to remove the voids, for example, it is possible to add a number of pitch impregnation steps (followed by carbonisation and graphitisation after each impregnation) to densify the matrix and to 'seal' the pores/voids in the material, which can enhance the thermal and mechanical properties.

An alternative could be metal [e.g. copper] impregnation. This should improve connectivity and mechanical properties, may have coefficient of thermal expansion advantages, should make the material easier to coat, and should improve adhesion to other materials These impregnation routes may be used with the rolling route, or with the following describer pressing route.

The Pressing Route

An alternative route to providing the thermal conductivity materials of the invention is by pressing.

Initial laboratory tests showed that thermal conductivities of well above ~500 W·m$^{-1}$K$^{-1}$ could be obtained by hot pressing the compositions given above for rolling. The hot pressing route initially investigated required the steps of:—

Mixing the components

Degassing the mixture at 350° C. in an inert atmosphere
[This used a heating/cooling programme:—
Ramp 1→Room temperature to 200° C. at 120° C./hr
Dwell 1→20 min
Ramp 2→200° C. to 350° C. at 50° C./hr
Dwell 2→90 min.
Ramp 3→350° C. to 200° C. at 120° C./hr
Dwell 3→0.0 min
Ramp 4→200° C. to Room temperature at 150° C./hr]

Placing the degassed mixture in a mould

Hot pressing
[This used a heating/pressing programme:—
Ramp to 360° C.
Dwell at this temperature for one hour
Ramp to 380° C.
Apply ~1 MPa
Ramp to 450° C. under this pressure
Dwell under the same pressure (~1 MPa) at 450° C. for half hour
Apply pressure of ~6 MPa
Allow to cool under pressure].

A graphitised composition made under this regime using graphite b) above and having higher graphite loading [90% graphite, 8.5% mesophase pitch, 1.5% ALS] gave a thermal conductivity of ~750 W·M$^{-1}$K$^{-1}$.

While giving high thermal conductivities, this route did not appear attractive to full scale production requiring long times under pressure and requiring a long heating and cooling schedule.

To test the variables and provide a production route, the applicants have looked to pressing and processing parameters and determined that optimising thermal conductivity requires optimising the variables:—
volume fraction graphite
size of graphite
degree of alignment
density of composite The applicants have further found that while graphitisation tends to provide the best thermal conductivity, it is not necessary to produce a high thermal conductivity composite.

The applicants have also found that much shorter processing times are feasible than by the hot-pressed route.

Table 2 shows a series of compositions [with proportions indicated in weight percent] using resin binders [novolac resin having approximately 90%<45 µm Bakelite™ PF0222 from Borden Resins] and various graphites alone. No plasticiser was used.

The compositions were made in a variety of manners. In all cases the materials were blended as dry materials.

Table 2 indicates the pressing route used. Three alternative pressing routes were used:—
Cold Press
Hor press using a die at ~120° C.
Cold press a preform and hot press that preform using a die at ~120° C.

Typical times in the hot press were ~2 minutes. Less or more may be appropriate as demanded by the materials used and characteristics sought. Pre-warming of the materials [powder or compact] before hot pressing is useful. After pressing the samples were kilned [carbonised] by exposure to temperatures>=900° C. in a coke bed, Where graphitised the samples were graphitised in like manner to the rolled samples.

Figure 3:
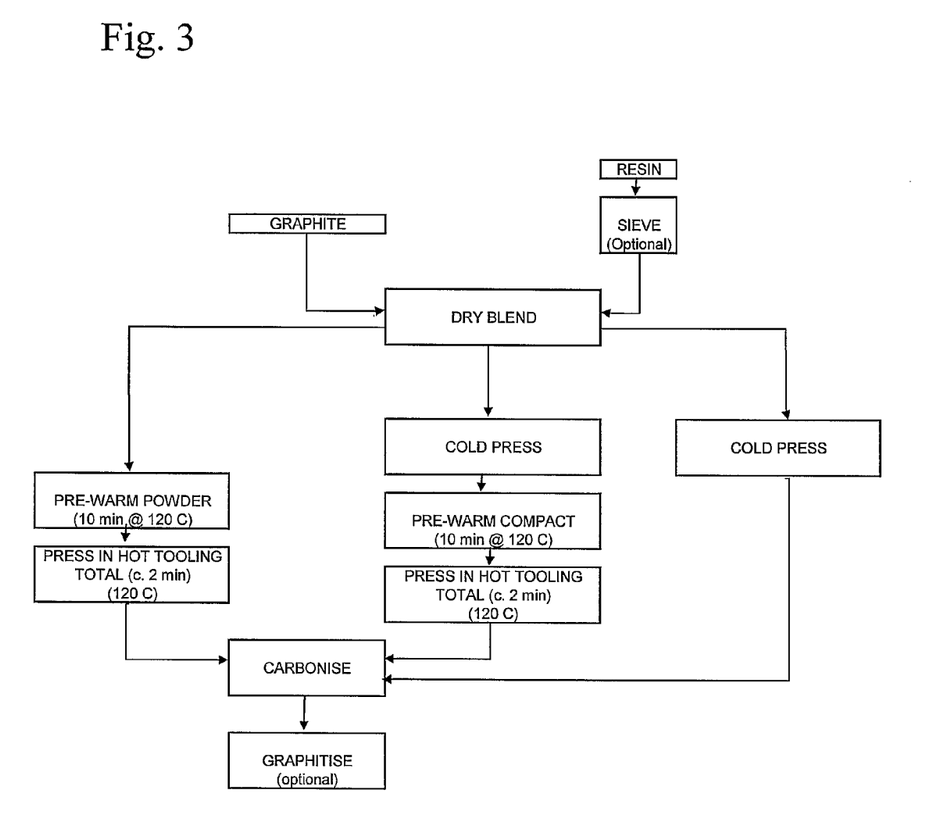
FIG. 3 shows alternative pressing routes.

FIG. 3 shows in schematic form these alternative routes.

Table 2 also indicates the cold pressed density, hot pressed density, kilned density, and graphitised density as relevant.

Lastly, Table 2 indicates the in-plane thermal conductivity measured [an average of two measurements taken in perpendicular directions].

Comparison of Samples 3 and 4 shows that graphitisation is not necessary to get high thermal conductivity. The difference in thermal conductivities is minor.

Samples 5 and 6 confirm that flake size is of importance—Sample 5 with a much smaller graphite particle size than sample 6 shows a ~20% lower thermal conductivity, despite having a higher density.

Samples 4 and 5 show this effect even more drastically, since they were pressed under identical pressing conditions.

Samples 7 and 8 show that not all graphites are the same. Although pressed under identical conditions, sample 8 had a much lower graphitised density and lower thermal conductivity due to the loss of impurities during graphitisation.

Samples 1 and 2 had the highest thermal conductivities and demonstrate that pressing conditions affect the materials. Despite Sample 2 having a higher graphite content in the initial mixture, and so having a higher density, it has a lower thermal conductivity than Sample 1.

TABLE 2

| Sample | Composition and processing | Press pressure MPa | Cold Pressed Density g·cm$^{-3}$ | Hot Pressed Density g·cm$^{-3}$ | Kilned Density g·cm$^{-3}$ | Graphitised Density g·cm$^{-3}$ | Thermal conductivity W·m$^{-1}$K$^{-1}$ |
|---|---|---|---|---|---|---|---|
| 1 | V-RFL/5% Resin cold-pressed then hot-pressed (120 C.) | 9.2 24.6 | 1.8 | 2.09 | 2.02 | 1.85 | 662 |
| 2 | V-RFL/2.5% Resin hot-pressed (120 C.) | 28.9 | | 2.06 | 2.02 | 1.89 | 578 |
| 3 | V-RFL/5% Resin cold-pressed | 27.7 | 1.94 | | 1.87 | | 561 |
| 4 | V-RFL/5% Resin, cold-pressed | 27.7 | 1.95 | | 1.89 | 1.77 | 545 |
| 5 | RFL/5% Resin, cold-pressed | 27.7 | 1.92 | | 1.83 | 1.74 | 288 |
| 6 | V-RFL/5% Resin cold-pressed | 18.5 | 1.87 | | 1.81 | 1.70 | 366 |
| 7 | V-RFL/5% Resin cold-pressed then hot-pressed (120 C.) | 13.9 24.6 | 1.82 | 2.06 | 2.00 | 1.85 | 502 |
| 8 | GRAF-X ™/5% Resin cold-pressed then hot-pressed (120 C.) | 13.9 24.6 | 1.81 | 2.06 | 2.01 | 1.70 | 366 |

Above it is claimed that the orientation of the graphite flakes in rolled materials can be improved by;
a) using finer mesophase pitch particle size
d) adopting slower roll speed
c) reducing thickness of the pressed preform prior to rolling.

To substantiate this, X-ray diffraction was performed on a number of rolled samples:—

Sample A75g comprised 10% pitch and 90% V-RFL graphite. The pitch was an AR mesophase pitch milled to a particle size ~500 μm. The sample was made by pressing a preform having a thickness of 5.66 mm, and rolling this down to a thickness of 1.05 mm using a roller speed of 20 rpm.

Sample A175 (as pressed) comprised 10% pitch and 90% V-RFL graphite. The pitch was an AR mesophase pitch milled to a particle size ~500 μm. The sample was made by pressing to a thickness of 2.13 mm.

Sample A175g had the same composition as A175g and took a pressed preform of a thickness of 2.13 mm and rolled it down to a thickness of 1.37 mm using a roll speed of 10 rpm.

Sample A308g comprised 10% AR mesophase pitch and 90% V-RFL graphite. The pitch was an AR mesophase pitch milled to a particle size<180 μm. A preform having a thickness of 2.14 mm was made, and this was rolled down to a thickness of 1.41 mm using a roller speed of 5 rpm.

Additional pressed materials were also made.

Sample 96-11 comprised 95% V-RFL graphite and 5% resin and was cold pressed.

Sample 96-7 was of the same composition as sample 96-11 but was hot pressed

Table 3 shows the results of X-ray diffraction texture analysis.

In the analysis, the (002) pole figures were measured using a Philips ATC-3 texture attachment using a cobalt anode, round collimator, no primary beam mask, Ni filter, a 4×4 mm scatter slit mask, 0.75 mm receiving slit and a sealed Xe proportional detector. Scan was continuous 0-85° Psi and 0-360° Phi in 2.5° steps with a counting time of 0.5 seconds per Phi step.

Since graphite is a very good diffractor of X-rays, and since the response of the X-ray detector used is not linear over about 500,000 counts per second, the count rate from the (002) reflections was limited by reducing the power supplied to the X-ray tube to the lowest possible setting, 20 kV and 10 A.

A Philips rolled copper standard was used for calibration and the results normalised to remove the effect of differing sample sizes and X-ray generator settings by deriving the random intensity by adding the intensities over the entire pole figure and dividing the result by the area of the pole figure.

The times random intensity figure thus gives a measure of orientation of the sample.

TABLE 3

| Sample | Psi Angle of (002) Maximum (Degrees) | "Times Random" Intensity of (002) Maximum | Width of (002) maximum in psi (Degrees) |
|---|---|---|---|
| A75g, Graphitised | 0 | 63 | 26 |
| A175, As Pressed | 0 | 74 | 28 |
| A175g | 0 | 101 | 27 |
| A308g | 0 | 123 | 22 |
| 96-7 | 0 | 84 | 21 |
| 96-11 | 0 | 68 | 22 |

Sample A175 as pressed (not rolled) has a times random intensity of 74. The intensity of this as-pressed ARMP composite is similar to the intensity measured on the pressed resin composite sample 96-11 which has a times random intensity of 68. This implies that both samples have about the same degree of orientation.

On rolling of A175 as-pressed sample, i.e. sample A175g in Table 1, the times random intensity increases to 101, again confirming that the degree of orientation increases after rolling.

Comparison of A75g [20 rpm rolling speed], A175g [10 rpm rolling speed] and A308g [5 rpm rolling speed and finer pitch size] indicates that lower rolling speed and finer pitch size can diminish shear texture in the rolled material which should increase in-plane conductivity.

The differential between 96-7 and 96-11 in the times random intensity figure indicates that in the pressed resin composite material, a greater degree of orientation can be achieved through hot pressing as opposed to cold pressing.

For resin bonded materials a hot cure route may be applicable in which cold-pressed preforms are pre-heated, typically to about 120° C. and placed in preheated tooling, typically at around 180° C. (although lower has been used). The pressing cycle consists of closing the press with minimal contact pressure on the preform, leaving to dwell (typically for about a minute although this depends upon the amount of volatiles in the resin). Raising the top tool for a short periods (typically under a minute) to allow the perform to breathe. Then closing the tool and pressing to the ultimate pressure typically about 27.6 MPa (4000 psi). Pressing can continue for an appropriate period before release of the preform, or optionally pressing can be discontinued after a short period (e.g. about a minute) and one or more further breathing and hot pressing cycles can follow. The optimum pressing route may vary according to the size and shape of the article to be pressed, and the nature of the resin used.

The invention encompasses pressed and/or rolled composite graphite materials in which the times random intensity of the (002) maximum is greater than 60, preferably greater than 80, and more preferably greater than 100.

SUMMARY

The present invention is therefore capable of providing a highly anisotropic material at relatively low cost in comparison with alternative methods of providing such anisotropy.

Although the above description and examples showed the production of flat sheets, the invention does contemplate the production of bodies comprising curved sheets in which the curvature is introduced either during the rolling/pressing process or by post-forming prior to carbonising and graphitising.

The graphite materials and bodies produced by the method claimed can form part of larger graphite bodies and the invention contemplates securing graphite bodies made according to the method either with each other or with graphite bodies made by other methods. The invention further contemplates that a body [e.g. a rolled sheet] made in accordance with the above described method can be secured to another graphite precursor body using a pitch or other carbonising adhesive and that the resultant assembly can be carbonised and optionally graphitised to form a unitary body.

The invention claimed is:

1. A graphite body comprising aligned graphite flakes bonded with a binder, in which the graphite has an average particle size of >200 μm, and in which the body has an in-plane thermal conductivity of >400 $Wm^{-1}K^{-1}$.

2. A graphite body, as claimed in claim 1, in which the graphite powder has a flake size distribution in which >50% by weight of the graphite has a flake size >200 μm.

3. A graphite body, as claimed in claim 2, in which the graphite powder has a flake size distribution in which >95% by weight of the graphite has a flake size >500 μm.

4. A graphite body, as claimed in claim 1, in which the binder is a carbonised residue of an organic precursor.

5. A graphite body, as claimed in claim 4, in which the binder is a graphitised residue of an organic precursor.

6. A graphite body, as claimed in claim 5, in which the binder comprises a graphitised residue of a mesophase pitch.

7. A graphite body, as claimed in claim 1, in which the body has a through plane thermal conductivity of <30 $Wm^{-1}K^{-1}$.

8. A graphite body, as claimed in claim 1, in which the times random intensity of the (002) maximum x-ray intensity measured using a cobalt source is greater than 60.

9. A graphite body, as claimed in claim 8, in which the times random intensity is greater than 80.

10. A graphite body, as claimed in claim 9, in which the times random intensity is greater than 100.

11. A graphite body, as claimed in claim 1, in which the body is curved.

12. A graphite body, as claimed in claim 1, in which the body has a density greater than 1.7 $g \cdot cm^{-3}$.

13. A graphite body, as claimed in claim 12, in which the body has a density greater than 1.75 $g \cdot cm^{-3}$.

14. A method of dissipating heat from an article, comprising placing a graphite body as claimed in claim 1, in contact with the article.

15. A method of forming a carbon body, having aligned graphite flakes bonded with a binder, which graphite has an average particle size of >200 μm, and which body has an in-plane thermal conductivity of >400 $Wm^{-1}K^{-1}$, comprising the steps of:
   a) forming a mixture of a graphite powder and a binder;
   b) pressing the mixture to align the graphite powder and to form a body of graphite and pitch;
   c) carbonising the body; and optionally
   d) graphitising the body.

16. A method, as claimed in claim 15, in which the pressing step comprises hot pressing.

17. A method, as claimed in claim 16, in which the pressing step comprises a cold pressing step prior to hot pressing.

18. A method, as claimed in claim 16, in which the pressing step comprises rolling.

19. A method, as claimed in claim 15, in which the graphite powder has a flake size distribution in which >50% by weight of the graphite has a flake size >200 μm.

20. A method, as claimed in claim 19, in which the graphite powder has a flake size distribution in which >95% by weight of the graphite has a flake size >500 μm.

21. A method as claimed in claim 15, in which the body of graphite and pitch is curved prior to carbonising.

22. A method, as claimed in claim 15, in which the body is secured to a graphite precursor body using a pitch or other carbonising adhesive prior to the carbonising step, and the resultant assembly is carbonised and optionally graphitised to form a unitary body.

23. A method, as claimed in claim 15, in which the mixture further comprises a plasticizer.

24. A method, as claimed in claim 23, in which the plasticiser functions also as a binder.

25. A method, as claimed in claim 24, in which the plasticiser is a lignosulphonate.

26. A method, as claimed in claim 25, in which the lignosulphonate is ammonium lignosulphonate.

27. A method of forming a highly oriented graphite material characterized by an in-plane thermal conductivity of >400 $Wm^{-1}K^{-1}$ by the steps of:

a) forming a mixture of a mesophase pitch with a graphite powder having an average particle size of >200 μm;
b) rolling the mixture to align the graphite powder and to form a body of graphite and pitch;
c) carbonising the body; and
d) graphitising the body.

28. A method, as claimed in claim 27, in which the mesophase pitch is a synthetic pitch.

29. A method, as claimed in claim 28, in which the mesophase pitch is produced by polymerisation of naphthalene or alkyl-naphthalene using a super acid catalyst.

30. A method, as claimed in claim 27, in which the mesophase pitch has a particle size of less than 500 μm.

31. A method, as claimed in claim 30, in which the mesophase pitch has a particle size of less than 200 μm.

32. A method, as claimed in claim 15, in which the mixture is pressed at a pressure between 6 and 28.9 MPa.

* * * * *